(12) United States Patent
Tyan et al.

(10) Patent No.: US 8,272,910 B2
(45) Date of Patent: Sep. 25, 2012

(54) ELECTROLUMINESCENT DEVICE HAVING IMPROVED LIGHT OUTPUT

(75) Inventors: Yuan-Sheng Tyan, Rochester, NY (US); Jin-Shan Wang, Rochester, NY (US); Raymond A. Kesel, Rochester, NY (US); Giuseppe Farruggia, Rochester, NY (US); Thomas Cushman, Rochester, NY (US)

(73) Assignee: Global OLED Technologies LLC, Wilmington, DE (US)

( * ) Notice: Subject to any disclaimer, the term of this patent is extended or adjusted under 35 U.S.C. 154(b) by 0 days.

(21) Appl. No.: 12/874,948

(22) Filed: Sep. 2, 2010

(65) Prior Publication Data

US 2010/0330716 A1   Dec. 30, 2010

Related U.S. Application Data

(62) Division of application No. 11/381,757, filed on May 5, 2006, now Pat. No. 7,851,995.

(51) Int. Cl.
*H01J 9/24* (2006.01)
(52) U.S. Cl. .................................................. 445/23
(58) Field of Classification Search ............... 445/23
See application file for complete search history.

(56) References Cited

U.S. PATENT DOCUMENTS

| | | |
|---|---|---|
| 5,834,893 A | 11/1998 | Bulovic et al. |
| 5,955,837 A | 9/1999 | Horikx et al. |
| 6,091,195 A | 7/2000 | Forrest et al. |
| 6,548,164 B1 * | 4/2003 | Bacon, Jr. ............. 428/343 |
| 6,777,871 B2 | 8/2004 | Duggal et al. |
| 6,787,796 B2 | 9/2004 | Do et al. |
| 2001/0026124 A1 | 10/2001 | Liu et al. |
| 2003/0127973 A1 | 7/2003 | Weaver et al. |
| 2004/0012980 A1 | 1/2004 | Sugiura et al. |
| 2004/0217702 A1 | 11/2004 | Garner et al. |
| 2005/0018431 A1 | 1/2005 | Shiang |
| 2005/0026530 A1 | 2/2005 | Toguchi et al. |
| 2005/0142379 A1 | 6/2005 | Juni et al. |
| 2005/0161693 A1 | 7/2005 | Sugiura et al. |
| 2005/0194896 A1 | 9/2005 | Sugita et al. |
| 2005/0225234 A1 | 10/2005 | Tyan et al. |
| 2006/0049745 A1 | 3/2006 | Handa et al. |
| 2007/0114925 A1 | 5/2007 | Cok |
| 2007/0200492 A1 | 8/2007 | Cok et al. |

FOREIGN PATENT DOCUMENTS

| | | |
|---|---|---|
| WO | 02/37568 | 5/2002 |
| WO | 02/37580 | 5/2002 |

OTHER PUBLICATIONS

Chang et al., High-Efficiency Organic Electroluminescent Device with Multiple Emitting Units, Jap. Journal of Appl. Phys. vol. 43, No. 9a, 2004, pp. 6418-6422.

* cited by examiner

*Primary Examiner* — Anh T. Mai
*Assistant Examiner* — Zachary J Snyder
(74) *Attorney, Agent, or Firm* — McKenna Long & Aldridge LLP

(57) ABSTRACT

An electroluminescent device including a transparent substrate, a securing layer, a light scattering layer, an electroluminescent unit including a transparent electrode layer, a light emitting element including at least one light emitting layer, and a reflecting electrode layer in that order, wherein the light scattering layer includes one monolayer of inorganic particles having an index of refraction larger than that of the light emitting layer and wherein the securing layer holds the inorganic particles in the light scattering layer.

10 Claims, 6 Drawing Sheets

100

200

500

ELECTROLUMINESCENT DEVICE HAVING IMPROVED LIGHT OUTPUT

CROSS-REFERENCE TO RELATED APPLICATIONS

This application is a divisional application of U.S. patent application Ser. No. 11/381,757, filed May 5, 2006, now allowed, which is incorporated by reference for all purposes as if fully set forth herein.

FIELD OF THE INVENTION

The present invention relates to electroluminescent devices, and more particularly, to thin-film electroluminescent device structures for improving light output.

BACKGROUND OF THE INVENTION

The present invention relates to electroluminescent devices. Examples of electroluminescent devices include organic light emitting devices (OLED), polymer light emitting devices (PLED), and inorganic electroluminescent devices.

A typical prior art electroluminescent device comprises a transparent substrate, a transparent first electrode layer, a light-emitting element including at least one light-emitting layer, and a reflecting second electrode layer. Light is generated in the electroluminescent device when electrons and holes that are injected from the two electrodes flowing through the light-emitting element and generating light by either recombination or impact ionization. The light-emitting element can include several layers of materials including at least a light-emitting layer where the emitted light is generated. In the case of an OLED device, for example, the light-emitting element can include an electron injection layer, an electron transport layer, one or more light-emitting layers, a hole transport layers, and a hole injection layer. One or several of these layers can be combined or eliminated and additional layers such as electron or hole blocking layers can be added. Most frequently, the first electrode layer is the anode and the second electrode layer is the cathode.

The light-emitting material has an index of refraction larger than that of the air and most frequently there is also one or more layers between the light emitting layer and air having index of refraction smaller than that of the light-emitting layer but larger than that of air. As the light travels from a higher index layer into a lower index layer total internal reflection can take place, the totally internal reflected light cannot transmit into the lower index layer and is trapped in the higher index layer. In the case of an OLED device, for example, the light emitting layer typically has an index of refraction of 1.7 to 1.8; the transparent electrode layer has an index of about 1.9, and the substrate has an index of about 1.5. Total internal reflection can take place at the transparent electrode/substrate interface. The fraction of the light from the light-emitting layer arriving at this interface with larger than critical angle from the normal is trapped within the organic layers and the transparent electrode layer and eventually absorbed by the materials in these layers or exited at the edges of the OLED device serving no useful functions. This fraction of light has been referred to as the organic-mode of light. Similarly, total internal reflection can take place at the substrate/air interface. The fraction of light arriving at this interface with larger than critical angle from the normal is trapped within the substrate, the transparent electrode layer, and the organic layers and eventually absorbed by the materials in the device or exited at the edges of the OLED device serving no useful function. This fraction of light has been referred to as the substrate-mode of light. It has been estimated that more than 50% of light generated by the light-emitting layer ends up as the organic mode of light, more than 30% ends up as the substrate mode of light, and less than 20% of light from the light-emitting layer can actually be outputted into the air and become useful light. The 20% of generated light that actually emits from the device has been referred to as the air-mode of light. Light trapping due to total internal reflection thus decreases drastically the output efficiency of electroluminescent devices.

Various techniques have been suggested to increase the efficiency of the thin-film electroluminescent devices by reducing the light trapping effect and allow the substrate-mode and organic-mode of light to emit from the device. These attempts are described in the references in detail and are included here by reference: U.S. Pat. Nos. 5,955,837, 5,834,893; 6,091,195; 6,787,796, 6,777,871; U.S. Patent Application Publication Nos. 2004/0217702 A1, 2005/0018431 A1, 2001/0026124 A1; WO 02/37580 A1, WO02/37568 A1.

In general, these attempts all provide an enhancement structure that can change the direction of light such that some of the light that would have been trapped because of total internal reflection can emit into the air. Most of the enhancement structures, however, are placed on the outside surface of the transparent substrate opposite to the surface where the electroluminescent device is disposed. These enhancement structures can only access the air-mode light and the substrate-mode light since the organic-mode of light never reaches these structures. Since the organic-mode light constitute about half of the light generated, these enhancement structures are not very effective in enhancing the output of the electroluminescence device. To effectively improve the extraction of all three modes of light, the enhancement structure has to be placed close to the transparent electrode. For a bottom emitting structure that the present invention relates to, placing the enhancement structure close to the transparent electrode means the enhancement structure has to be placed inside the electroluminescent device between the transparent electrode and the substrate. Constructing this internal enhancement structure presents difficult technical challenges, however, since thin-film electroluminescent devices are very delicate. Placing the enhancement structure inside the device structure can cause many undesirable consequences including totally shorting out the devices. Although there have been suggestions of internal enhancement structures, no practical device structure have been described in the prior art that resulted in effective enhancement of light extraction efficiency.

SUMMARY OF THE INVENTION

The present invention provides electroluminescent devices with improved light extraction efficiency and methods for fabricating the devices.

In one embodiment of the present invention, an electroluminescent device comprises a transparent substrate, a securing layer, a light scattering layer, an electroluminescent unit including a transparent electrode layer, a light-emitting element including at least one light-emitting layer, and a reflecting electrode layer in that order, wherein the light scattering layer includes one monolayer of inorganic particles having an index of refraction larger than that of the light emitting layer and wherein the securing layer holds the inorganic particles in the light scattering layer.

In another embodiment of the present invention, an electroluminescent device comprises a transparent substrate, a securing layer, a light scattering layer, a surface smoothing layer, an electroluminescent unit including a transparent electrode layer, a light-emitting element including at least one light-emitting layer, and a reflecting electrode layer in that order, wherein the light scattering layer includes one monolayer of inorganic particles having an index of refraction larger than that of the light-emitting layer and wherein the securing layer holds the inorganic particles in the light scattering layer.

The present invention has the advantage that it increases the light output of an electroluminescent device; it further has the advantage that the device can be fabricated practically at low cost.

DETAILED DESCRIPTION OF THE INVENTION

The present invention is described below with respect to OLED devices. It should be understood, however, that the same or similar can also be applied to polymer light emitting devices (PLED) and inorganic electroluminescent devices.

Figure 1:
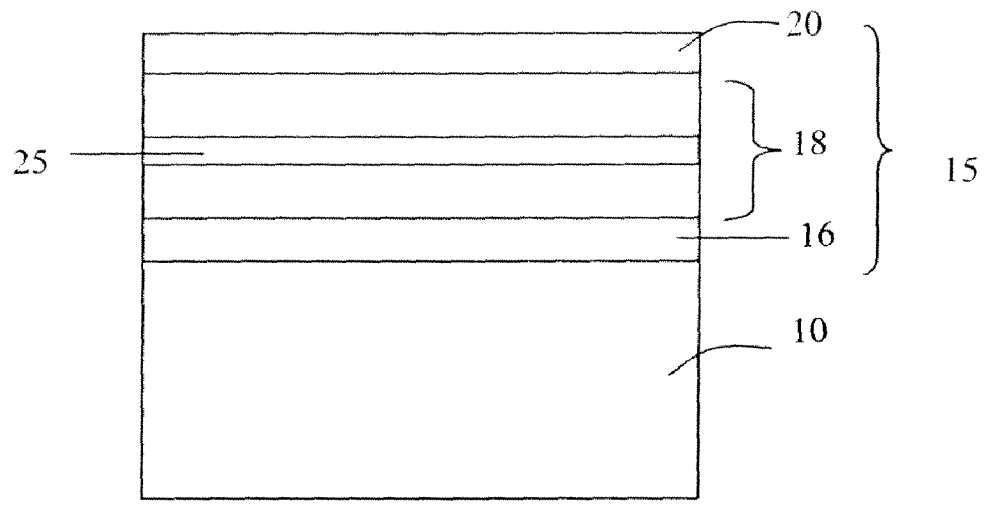
FIG. 1 is a schematic cross section of a prior art electroluminescent device.

Referring to FIG. 1 there is shown a common prior art OLED device 100 as is well known in the art. OLED device 100 includes a substrate 10, an electroluminescent unit 15 including a transparent electrode layer 16, a light emitting element 18, and a reflecting electrode layer 20 in that order. Light emitting element 18 includes at least a light-emitting layer 25 and can have other layers including an electron injection layer, an electron transport layer, more light-emitting layers, a hole transport layers, and a hole injection layer. In operation a voltage is applied between transparent electrode layer 16 and reflecting electrode layer 20 causing electrical carriers to be injected into light emitting layer 25. As these carriers combine, light is generated in light emitting layer 25. OLED device 100 is commonly referred to as a bottom-emitting device wherein light generated from light emitting layer 25 is transmitted through transparent electrode layer 16 and through transparent substrate 10 into the air. Most commonly the index of refraction of light-emitting layer 25 is higher than that of substrate 10 that in turn is higher than the index of refraction of the air; and most commonly the index of refraction of transparent electrode layer 16 is higher than that of light-emitting layer 25. Light generated from the light-emitting layer 25 therefore suffers total internal reflection both at the transparent electrode layer 16/substrate 10 interface and at substrate 10/air interface. This internally reflected light, which can be a significant portion of the generated light, is trapped in OLED device 100. The trapped light is eventually absorbed by the various materials in the device or exited at the edges of OLED device 100 servicing no useful functions. The output efficiency of OLED device 100 is thus significantly reduced.

Figure 2:
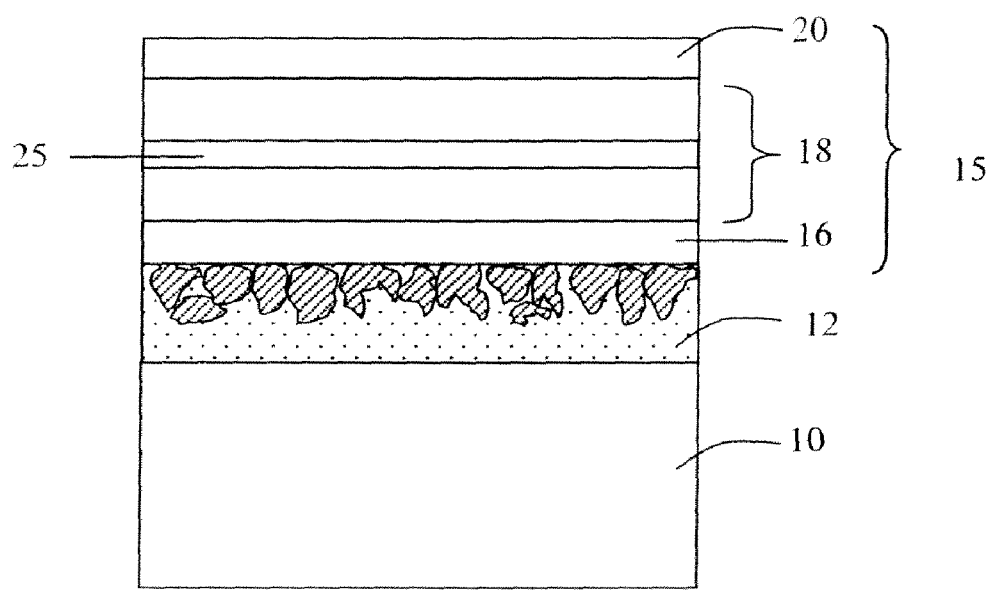
FIG. 2 is a schematic cross section of an OLED device in accordance with the present invention.

Referring to FIG. 2 there is shown schematically an OLED device 200 in accordance with the present invention. OLED device 200 includes a substrate 10, a securing layer 12, a scattering layer 14, an electroluminescent unit 15 including a transparent electrode layer 16, a light-emitting element 18 including at least one light emitting layer 25, and a reflecting electrode layer 20 in that order. OLED device 200 is characterized in that scattering layer 14 includes a monolayer of scattering particles having an index of refraction larger than that of light-emitting layer 25 and wherein securing layer 12 holds the inorganic particles in light scattering layer 14. The size of the scattering particles is preferably between 0.1 to 10 micrometers and most preferably between 0.5 and 2.0 micrometers. The scattering particles can have a distribution of sizes in these ranges. The shape of the particle can be nearly ellipsoidal or it can be irregular. The irregular shape is preferred for providing enhanced extraction efficiency. Metal oxides including titanium oxide, tantalum oxide, niobium oxide, zirconium oxide, aluminum oxide, tungsten oxide, antimony oxide, vanadium oxide, molybdenum oxide, or mixtures thereof are preferred materials for use as scattering particles. For the purpose of the present invention a monolayer of scattering particles is defined as a layer wherein the projection of the particles by a light shining normal to OLED device 200 covers at least 60% of the surface area of OLED device 200 covered by scattering layer 14 and the average thickness of scattering layer 14 is less than the average size of the scattering particles. For the purpose of the present invention the average thickness of scattering layer 14 is defined as the total volume of the scattering particles in scattering layer 14 divided by the surface area of OLED device 200 covered by scattering layer 14. In addition to scattering particles scattering layer 14 may further include other materials including binders, surfactants, adhesives, or wetting agents to facilitate the fabrication of layer 14 during manufacturing. Useful binder materials include polyurethane. Scattering layer 14 can be applied by methods including spin-coating, silk-screening, roll printing, inkjet printing, spraying, and squeegee coating.

Since scattering layer 14 includes scattering particles of ellipsoidal or irregular shapes, the interface between scattering layer 14 and transparent electrode layer 16 may not be smooth. There can exist various gaps between the individual scattering particles in scattering layer 14 and between scattering particles and transparent electrode layer 16. An aspect of the present invention is that securing layer 12 contacts conformingly the surfaces of the scattering particles in scattering layer 14. Securing layer 12 fills most of the voids between the scattering particles in scattering layer 14 and most of the gaps between the scattering particles and transparent electrode layer 16. Securing layer 12 is preferably made from a securing material 12a that is in a liquid form or is pliable and during the process of fabrication spreads across the surface of light scattering layer 14 to form securing layer 12. Preferred materials for securing layer 12 include UV curable or heat curable polymeric materials including polyurethanes, epoxies, polyesters, acrylates, or acrylics and pressure sensitive adhesive materials. Securing material 12a can be a polymer precursor material and the polymerization to form securing layer 12 can be achieved using UV radiation or heat.

As light generated from light-emitting layer 25 in light-emitting element 18 transmits through transparent electrode layer 16, it impinges upon scattering layer 14 and becomes scattered. Some of the generated light that would have been trapped due to total internal reflection at the transparent electrode 16/substrate 10 interface or the substrate 10/air interface is scattered into a smaller than critical angle and is now able to emit into the air. Because the index of refraction of the scattering particles in scattering layer 14 is higher than that of light-emitting layer 25, the air mode, the substrate mode, and the organic mode of light can all penetrate into scattering layer 14 and be scattered effectively. The proximity of the scattering particles to transparent electrode layer 16 also ensures good light penetration and good scattering efficiency even in places where there is a gap between a scattering particle and transparent electrode layer 16 and securing layer 12 fills the gap. The output efficiency of OLED device 200 can be further improved by choosing a securing layer 12 having an index of refraction less than or equal to that of substrate 10 so that light scattered by scattering layer 14 into securing layer 12 suffers less internal reflection loss at securing layer 12/substrate 10 interface or at substrate 10/air interface.

Substrate 10 is transparent to the emitted light. It can be rigid or flexible and it can comprise materials such as glass or plastic. Transparent electrode layer 16 is most preferably a conductive transparent oxide layer including indium-tin oxide, indium-zinc oxide, tin-oxide, aluminum-zinc oxide, and cadmium-tin oxide. Material for reflecting electrode layer 20 is selected from Ag, Au, Al, or alloys thereof, most preferably is selected from Ag or alloys of Ag.

Figure 3:
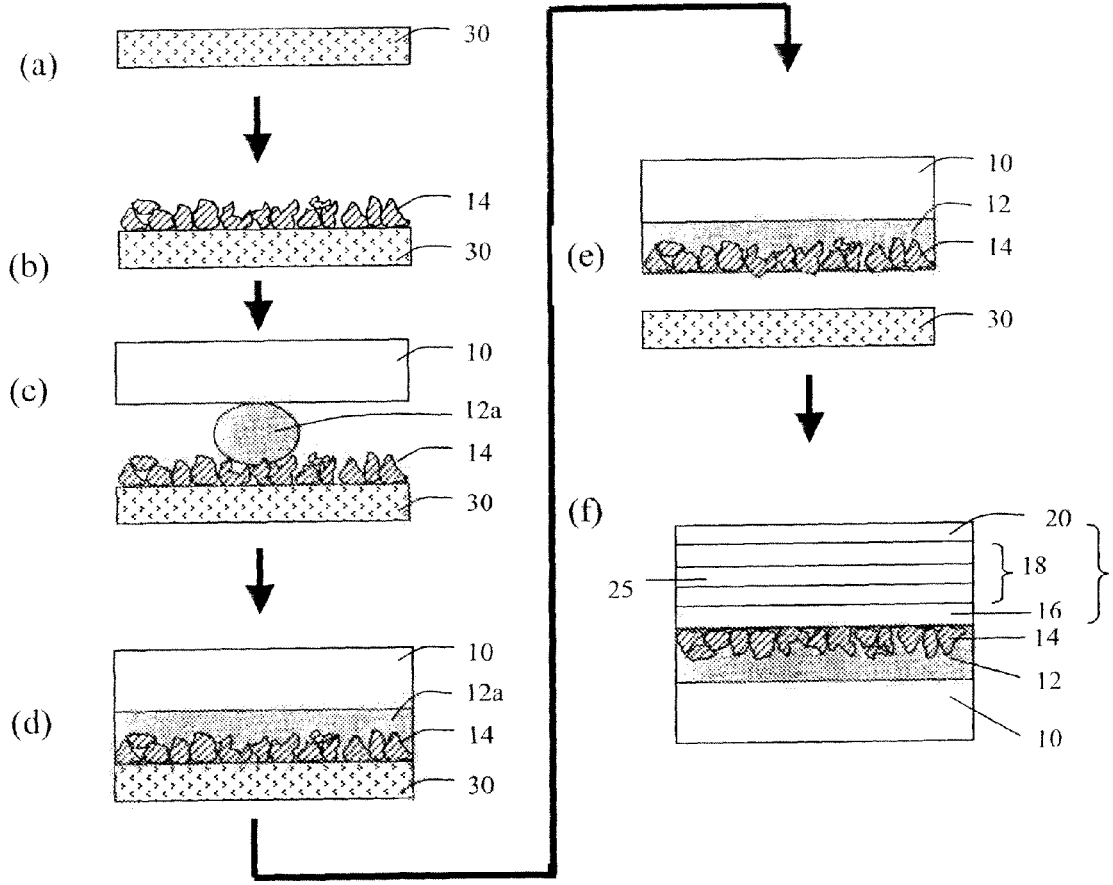
FIG. 3 shows a method for fabricating an OLED depicted in FIG. 2 in accordance with the present invention.

FIG. 3 is a schematic representation of a method for fabricating OLED device 200 in accordance with the present invention including the steps of:
a) providing a carrier 30 having at least one smooth surface;
b) disposing a scattering layer 14 including a monolayer of scattering particles over the smooth surface of carrier 30;
c) providing a substrate 10 in relative position to carrier 30 and dispensing a quantity of a securing material 12a between substrate 10 and carrier 30;
d) engaging substrate 10 and securing material 12a to form securing material 12a into a securing layer 12 between substrate 10 and scattering layer 14;
e) separating substrate 10 with the attached securing layer 12 and scattering layer 14 from carrier 30; and
f) forming an electroluminescent unit 15, including a transparent electrode layer 16, a light-emitting element 18 including at least one light-emitting layer 25, and a reflecting electrode layer 20, on light scattering layer 14.

Carrier 30 can be made of a glass, a metal, a polymer, or a ceramic. Carrier 30 can be rigid or flexible and is most preferably a flexible polymeric material. Carrier 30 can be in a roll form prior to any of the steps above and it can be cut into sheet form prior to any of the steps above.

In one preferred embodiment of the present invention, securing material 12a is a curable material in a compliable or liquid form and there includes a curing step between steps d and e above.

Figure 4:
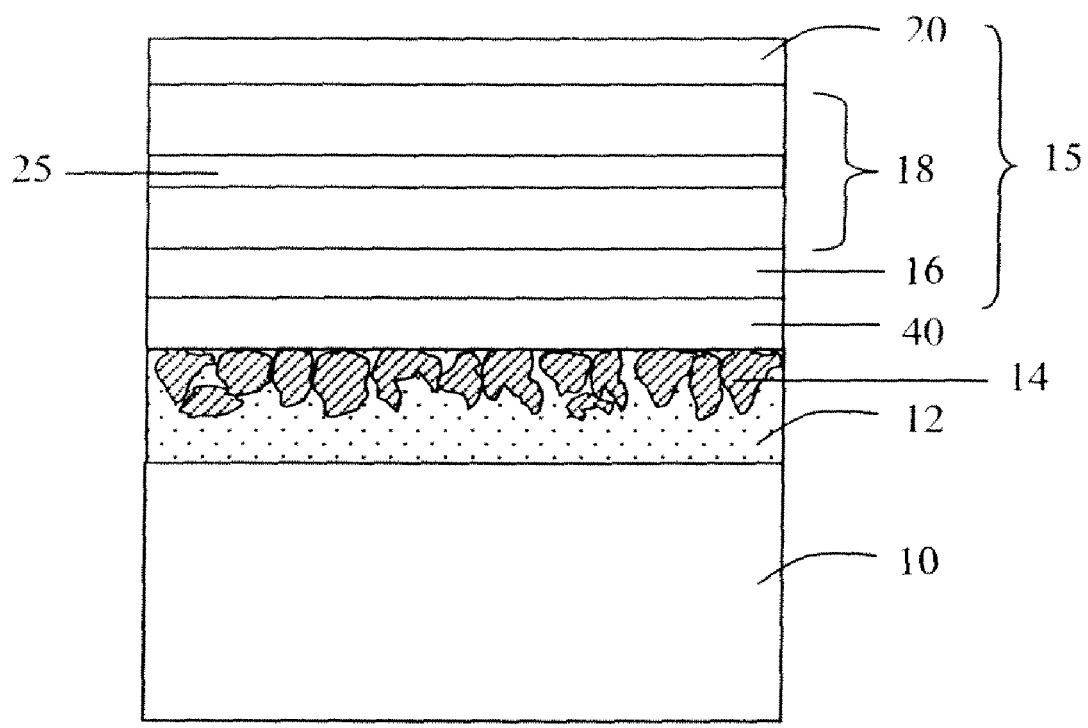
FIG. 4 is a schematic cross section of another OLED device including a smoothing layer in accordance with the present invention.

FIG. 4 is a schematic representation of another embodiment of the present invention. OLED device 300 includes substrate 10, securing layer 12, scattering layer 14, surface smoothing layer 40, electroluminescent unit 15 including transparent electrode layer 16, light-emitting element 18 including at least one light-emitting layer 25, and reflecting electrode layer 20 in that order. Surface smoothing layer 40 is preferably a layer applied in a liquid form or from a solution such that it can cover imperfections on the surface of scattering 14 and solidified after application. It provides a smooth surface for the subsequent deposition of electrode layer 16, light-emitting element 18, and reflecting electrode layer 20. The function of surface smoothing layer 40 is to reduce or eliminate imperfections on the surface of scattering layer 14 which might cause shorting or other undesirable effects on OLED device 300. Surface smoothing layer 40 preferably has a high index of refraction and more preferably has an index of refraction equal to or higher than that of light-emitting layer 25 to improve light coupling into scattering layer 14 and to improve light extraction efficiency. Surface smoothing layer 40 can have an index of refraction smaller than that of light-emitting layer 25. In this case, however, the thickness of surface smoothing layer 40 is preferably smaller than 1 μm and most preferably smaller than 0.5 μm. If the index of refraction of surface smoothing layer 40 is larger than that of light-emitting layer 25 than the thickness of surface smoothing layer 40 can be between 0.01 μm to 10 μm. Surface smoothing layer 40 is preferably a layer applied in a liquid form or from a solution and can include a polymeric material or a composite material comprising one or more polymeric materials and nano-particles of an inorganic material. For the purpose of the present invention nano-particles are particles having a size less than about 100 nm. Polymeric materials for surface smoothing layer 40 can include polyvinylcarbazole (PVK) and polyvinylpyrrolidone (PVP). Preferably, surface smoothing layer 40 includes nano-particles of high index metal oxide materials dispersed in a polymeric matrix. Metal oxides including titanium oxide, tantalum oxide, niobium oxide, zirconium oxide, aluminum oxide, tungsten oxide, antimony oxide, vanadium oxide, molybdenum oxide, or mixtures thereof are preferred materials for use as nano-particles. Surface smoothing layer 40 can be prepared by spin-coating, silk-screening, roll printing, inkjet printing, spraying, or squeegee coating.

Figure 5:
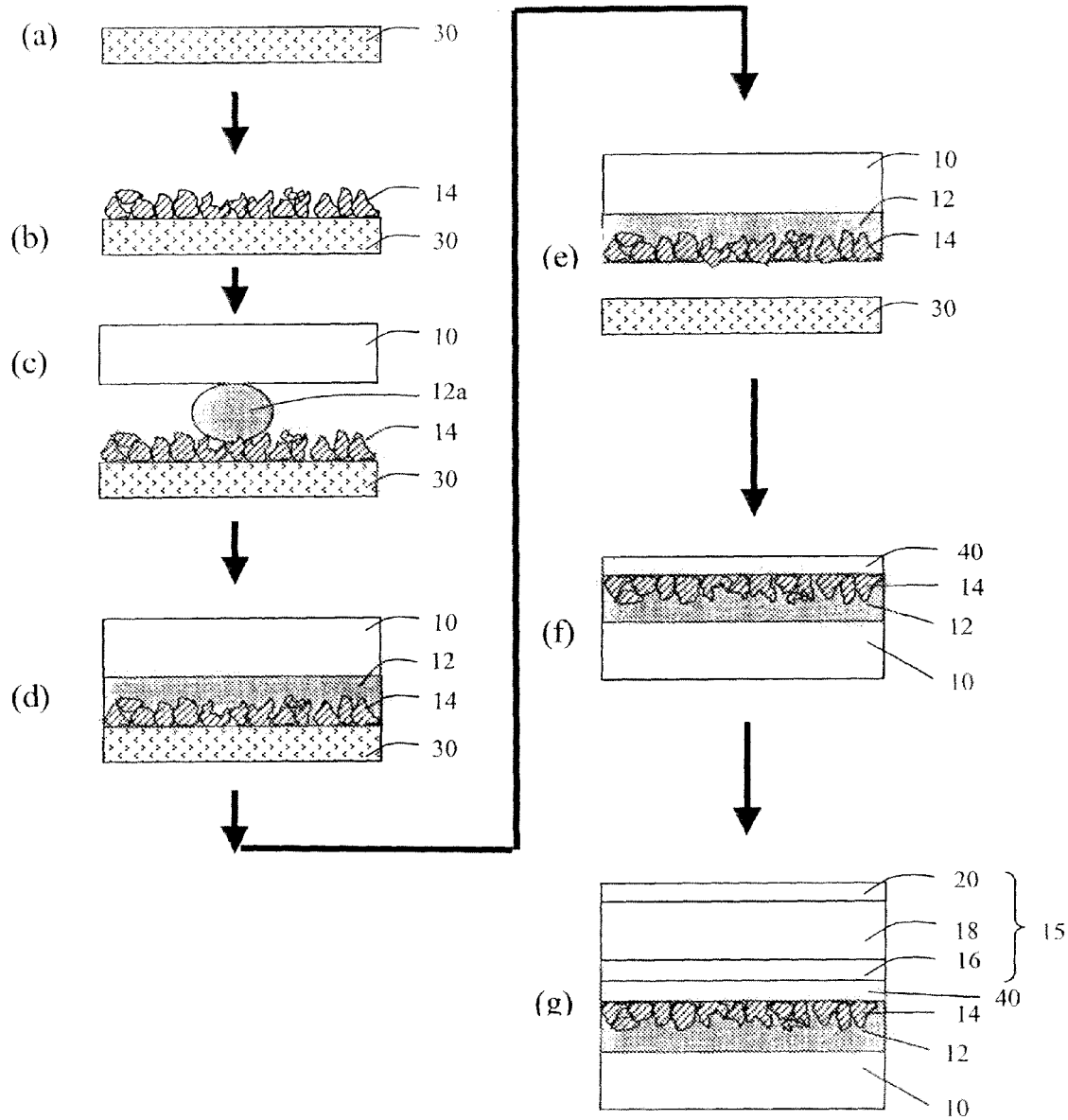
FIG. 5 shows a method for fabricating an OLED device depicted in FIG. 4 in accordance with the present invention.

FIG. 5 illustrate a method for fabricating OLED device 300 in accordance with the present invention includes the steps of:
a) providing a carrier 30 having at least one smooth surface;
b) disposing a scattering layer 14 comprising a monolayer of scattering particles over the smooth surface of carrier 30;
c) providing a substrate 10 in relative position to carrier 30 and dispensing a quantity of a securing material 12a between substrate 10 and carrier 30;
d) engaging substrate 10 and securing material 12a to form securing material 12a into a securing layer 12 between substrate 10 and scattering layer 14;
e) separating substrate 10 with the attached securing layer 12 and scattering layer 14 from carrier 30;
f) providing a surface smoothing layer 40 over scattering layer 14; and
g) forming an electroluminescent unit 15 on light scattering layer 14.

Figure 6:
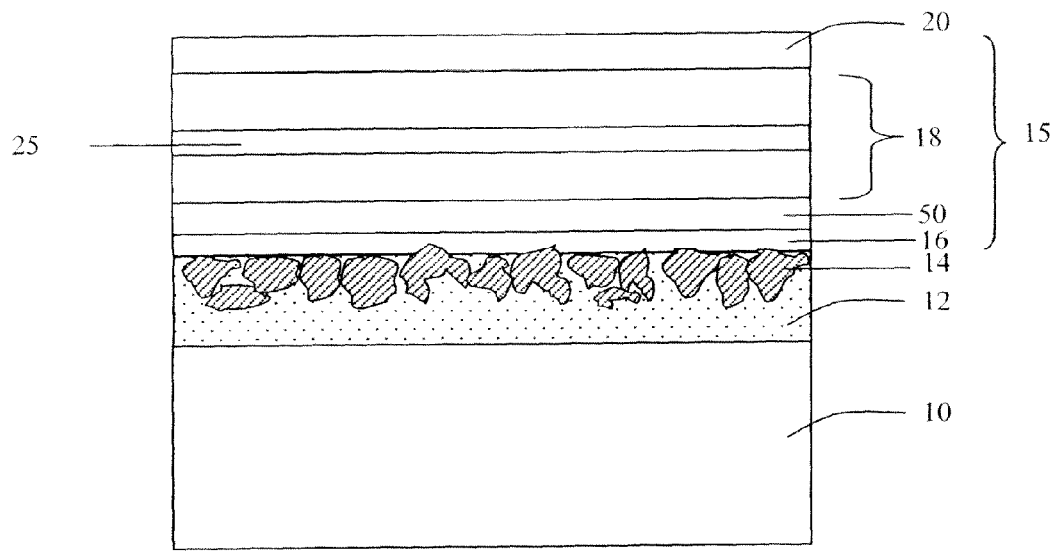
FIG. 6 is a schematic cross section of another OLED device including a short reduction layer in accordance with the present invention.

FIG. 6 is a schematic representation of another embodiment of the present invention. OLED device 400 includes a substrate 10, a securing layer 12, a scattering layer 14, an electroluminescent unit 15 including a transparent electrode layer 16, a short reduction layer 50, a light-emitting element 18 including at least one light-emitting layer 25, and a reflecting electrode layer 20 in that order. Short reduction layer 50 is a high resistivity layer capable of reducing the detrimental effects of shorting defects. Such layers are described in co-pending, commonly assigned U.S. Ser. No. 10/822,517, filed Apr. 12, 2004, the disclosure of which is incorporated herein by reference. Short reduction layer 50 preferably has a thickness between 10 nm and 200 nm, most preferably between 20 nm and 100 nm, and a sheet resistivity between $1\times10^6$ ohms/square to about $1\times10^{12}$ ohms/square. Preferred material for short reduction layer 50 includes organic materials PEDOT/PSS, polythiophene, and polyaniline; inorganic materials molybdenum oxide, vanadium oxide, antimony oxide, bismuth oxide rhenium oxide, tantalum oxide, tungsten oxide, niobium oxide, nickel oxide, or mixtures thereof. The inorganic materials can be prepared by common vacuum deposition techniques such as evaporation and sputtering. By properly controlling deposition conditions including oxygen partial pressure a wide range of resistivity values can be obtained to make them suitable as a short reduction layer. Other suitable materials for short reduction layers can be obtained by combing these oxides with more conductive oxides such as indium oxide, gallium oxide, zinc oxide, tin oxide, etc. Other materials suitable for use as short reduction layers include mixtures of a higher conductivity oxide material with an insulating material selected from oxides, fluorides, nitrides, sulfides, and mixtures thereof. The resistivity of the mixture layer can be tuned to the desired range by adjusting the ratio of these two kinds of materials. The higher conductivity oxides include indium oxide, gallium oxide, zinc oxide, tin oxide, and mixtures thereof including indium-tin oxide and indium-zinc oxide. Doped oxides such as aluminum-doped zinc oxide can also be used. Useful insulating materials include tantalum oxide, silicon oxide, germanium oxide, zinc sulfide, silicone nitride, and mixtures thereof including mixtures of zinc sulfide and silicone oxide. One particular useful material for short reduction layer is a mixture of zinc sulfide or zinc sulfide-silicone oxide mixture with indium-tin oxide, indium oxide, or tin oxide. Layers containing a mixture of materials can be prepared by co-sputtering form two or more targets or by co-evaporation from two or more vapor sources. Alternatively these layers can be prepared by sputtering from a pre-mixed target or by evaporation from a pre-mixed source including the use of flash evaporation or wire-feed evaporation. Organic materials for short reduction layer can be prepared by spin-coating, silk-screening, roll printing, inkjet printing, spraying, or squeegee coating.

Figure 7:
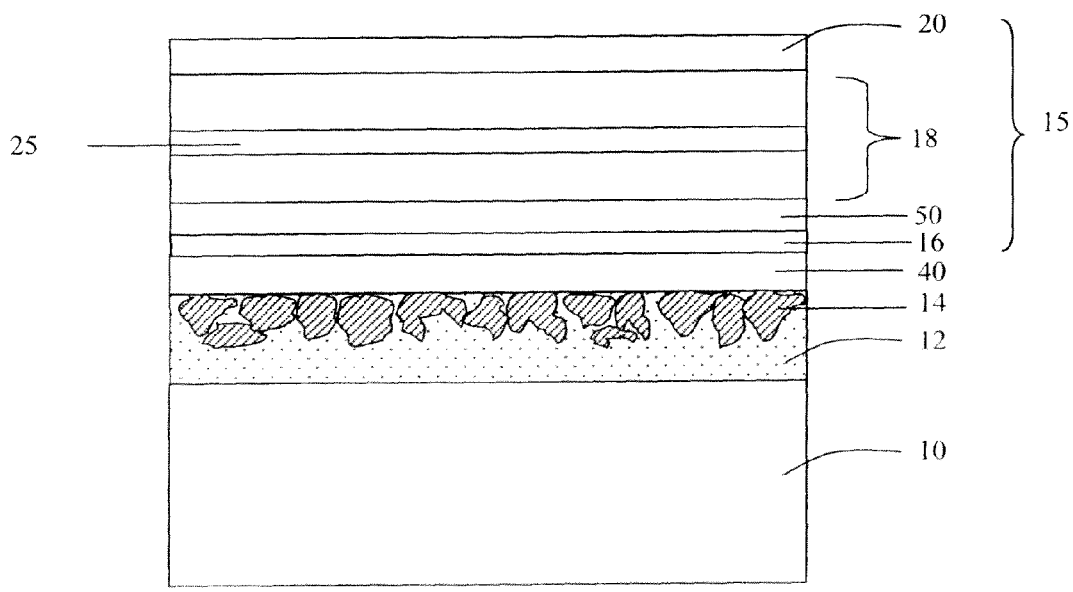
FIG. 7 is a schematic cross section of another OLED device including both a smoothing layer and a short reduction layer in accordance with the present invention.

FIG. 7 is a schematic representation of another embodiment of the present invention. OLED device 500 is similar in structure to OLED device 400 except that a surface smoothing layer 40 is disposed between scattering layer 14 and electroluminescent unit 15.

Figure 8:
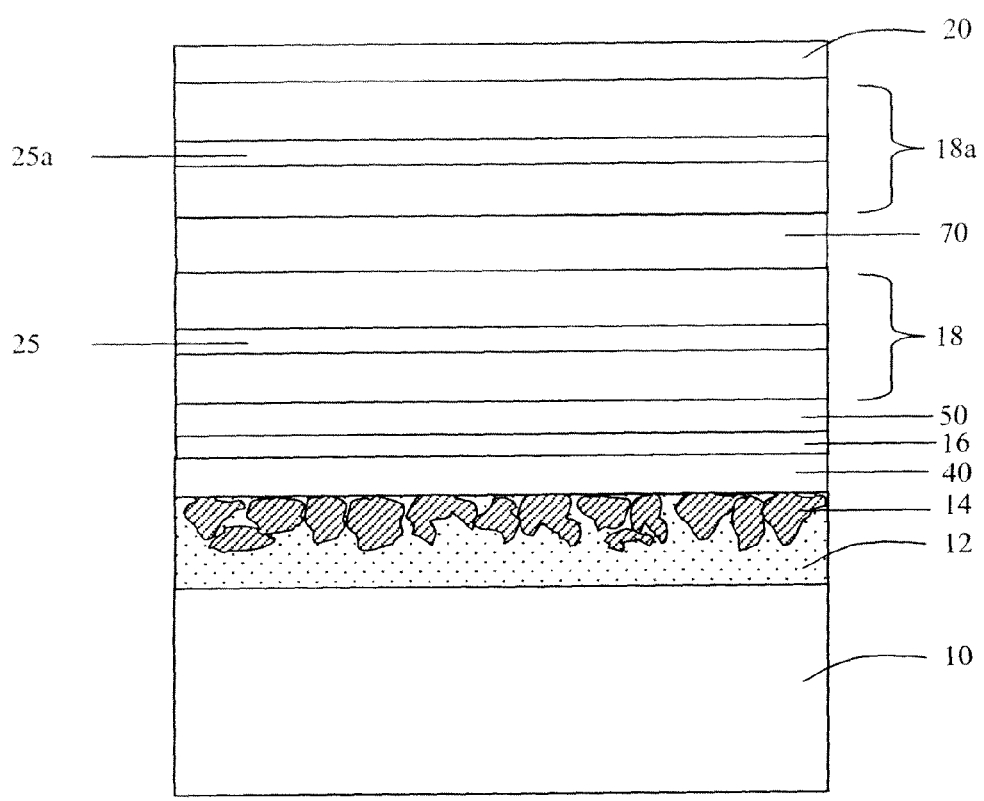
FIG. 8 is a schematic cross section of another OLED device with a stacked architecture in accordance with the present invention.

FIG. 8 is a schematic representation of another embodiment of the present invention. OLED device 600 is similar in structure to OLED device 500 except that there are two light emitting elements 18 and 18a and a connecting unit 70 disposed between the transparent electrode 16 and the reflecting electrode 20. OLED device 600 is said to have a stacked architecture (Chang et al Japanese Journal of Applied Physics 43, 9a, 6418 (2004); Liao et al. Applied Physics Letters 84, 167 (2004)). Each light emitting element 18 or 18a has at least one light emitting layer 25 and 25a. When a current is applied between the transparent electrode 16 and the reflecting electrode 20 it passes through both light emitting layers 25 and 25a and causes both layers to emit light and thus the light output is increased. Connecting unit 70 provides electron injection into the electron-transporting layer and hole injection into the hole-transporting layer of the two adjacent organic EL units. Preferably, the connecting unit is transparent to the light emitted by the tandem OLED device. Also preferably, the connecting unit does not have too much in-plane electrical conductivity in order to prevent cross talk if OLED device 600 is to be used in a pixilated display device or a segmented lighting device. Scattering layer 14 in accordance with the present invention improves the extraction efficiency of light emitted from both the light emitting layers. FIG. 8 depicts an OLED device having two light emitting elements. It is understood that more than two light emitting elements can be included in a device constructed in accordance with the present invention and an improvement in light extraction efficiency is similarly expected.

OLED devices 200, 300, 400, 500, or 600 can be pixilated or segmented. They can be used as display device or an illuminating device. In the former case the OLED devices can be part of a passive matrix structure or an active matrix structure. In the latter case they can be part of a monolithic serial-connected structure as disclosed in U.S. Pat. No. 6,693,296.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 12 | securing layer |
| 12a | securing material |
| 14 | scattering layer |
| 15 | electroluminescent unit |
| 16 | transparent electrode layer |
| 18, 18a | light emitting element |
| 20 | reflecting electrode layer |
| 25, 25a | light emitting layer |
| 30 | carrier |
| 40 | surface smoothing layer |
| 50 | short reduction layer |
| 70 | connecting unit |
| 100 | OLED device |
| 200 | OLED device |
| 300 | OLED device |
| 400 | OLED device |
| 500 | OLED device |
| 600 | OLED device |

The invention claimed is:

1. A method for providing an electroluminescent device comprising steps in the following order:
   (a) providing a carrier having at least one smooth surface;
   (b) disposing a scattering layer comprising a monolayer of scattering particles over the smooth surface of the carrier;
   (c) providing a substrate in relative position to the carrier;
   (d) dispensing a quantity of the securing material between the substrate and the carrier;
   (e) engaging the substrate and the securing material to form the securing material into a layer between the substrate and the scattering layer;
   (f) separating the substrate with the attached securing layer and the scattering layer from the carrier; and
   (g) forming an electroluminescent unit on the light scattering layer.

2. The method of claim 1 wherein the securing material is polymer precursor and further including the step of polymerizing the polymer precursor before step e.

3. The method of claim 1 wherein the securing material is a liquid.

4. The method of claim 1 wherein the securing material is pliable and is deposited on the light scattering layer and the process of engaging the substrate with the pliable securing material spreads the securing material across the surface of the light scattering layer.

5. The method of claim 1 further including providing a surface smoothing layer over the scattering layer.

6. The method of claim 1 further including providing a short reduction layer.

7. The method of claim 1 wherein the carrier is a rigid plate of glass or plastic.

8. The method of claim 1 wherein the carrier is a flexible sheet.

9. The method of claim 1 further including proving the carrier in a roll form and cutting the carrier into sheets after any of the process steps.

10. The methods of claim 1 further including applying a release agent is to the surface of the carrier plate prior to the application of the scattering layer.

* * * * *